United States Patent [19]

Davari et al.

[11] Patent Number: 4,889,819

[45] Date of Patent: Dec. 26, 1989

[54] METHOD FOR FABRICATING SHALLOW JUNCTIONS BY PREAMORPHIZING WITH DOPANT OF SAME CONDUCTIVITY AS SUBSTRATE

[75] Inventors: Bijan Davari, Mahopac; Eti Ganin, Peekskill; David L. Harame, Mohegan Lake; George A. Sai-Halasz, Mount Kisco, all of N.Y.

[73] Assignee: International Business Machines Corporation, Armonk, N.Y.

[21] Appl. No.: 196,398

[22] Filed: May 20, 1988

[51] Int. Cl.$^4$ .......................................... H01L 21/265
[52] U.S. Cl. ........................................ 437/27; 437/28; 437/950
[58] Field of Search ................. 437/27, 28, 29, 30, 437/950; 148/DIG. 144

[56]  References Cited

U.S. PATENT DOCUMENTS

| 4,456,489 | 6/1984 | Wu ................................ 357/2 |
| 4,584,026 | 4/1986 | Wu et al. ........................ 357/91 |
| 4,617,066 | 10/1986 | Vasudev ......................... 357/91 |
| 4,637,836 | 1/1987 | Flatley et al. .................. 437/27 |
| 4,655,875 | 4/1987 | Wada et al. ..................... 156/643 |

FOREIGN PATENT DOCUMENTS

| 53-120263 | 10/1978 | Japan ............................ 437/27 |
| 55-91822 | 11/1980 | Japan ............................ 437/27 |
| 55-156373 | 12/1980 | Japan ............................ 437/27 |
| 61-26220 | 2/1986 | Japan ............................ 437/27 |
| 0208577 | 1/1987 | Japan ............................ 437/27 |

Primary Examiner—Olik Chaudhuri
Attorney, Agent, or Firm—Pollock, Vande Sande & Priddy

[57]  ABSTRACT

Shallow junctions of a first conductivity type in a semiconductor of the opposite conductivity type are fabricated by doping the substrate with a dopant of an opposite conductivity type than the first conductivity type to preamorphize portions of the substrate. The dopant of the opposite conductivity type must have a molecular weight that is higher than the molecular weight of the substrate. The substrate is then doped with the dopant of the first conductivity type to form the shallow junctions.

15 Claims, No Drawings

METHOD FOR FABRICATING SHALLOW JUNCTIONS BY PREAMORPHIZING WITH DOPANT OF SAME CONDUCTIVITY AS SUBSTRATE

TECHNICAL FIELD

The present invention is concerned with a method for fabricating shallow junctions in a semiconductor substrate.

In particular, the present invention is concerned with a method whereby shallow, well-defined junctions are obtained and the problem of ion channeling tail is alleviated.

The present invention is especially advantageous for providing shallow junctions of boron or phosphorus or arsenic into a silicon substrate.

BACKGROUND ART

There is a general tendency in the electronics industry towards producing semiconductor devices having smaller device dimensions to fabricate very large scale integrated and very high speed integrated circuits.

One of the problems encountered has been the difficulty of fabricating shallow junctions by doping. In fact, in the case of very shallow junctions, such as about 1500 angstroms and below, the depth the dopant elements reach due to implant channeling becomes an important issue. This is especially significant when dealing with relatively light dopants such as boron and phosphorus.

To avoid channeling, the semiconductor substrate, such as silicon, is typically preamorphized before implantation of the dopant. It would be desirable that such treatment of the substrate would render it amorphous to a well-defined depth beyond which essentially no crystal damage has penetrated. Then the dopant species could be implanted to that depth which keeps it completely in the amorphous region and, therefore, the dopant could not channel. Upon activation, the dopant could be made so as to diffuse just past the original amorphized interface and thereby provide a junction that is located in a fully defectfree region. However, this desired situation has not been fully realized or achieved. This is due to the fact that the preamorphization, itself, has been carried out by employing some type of implantation.

The customary implantations to date involve employing silicon or a heavy element such as germanium, tin, or indium in connection with boron type junctions, but such have not been entirely satisfactory. For instance, the use of silicon implantation into silicon has led to extended defects penetrating deeply beyond the amorphized region. Furthermore, when dealing with still shallower junctions, such as 1000 angstroms and below, it has been observed that the species, used to preamorphize, tend, themselves, to channel and lead to tails in the above $10^{16}/cm^3$ range which penetrate well-below the amorphized region and the intended junction depth.

Accordingly, it would be advantageous to preamorphize the semiconductor substrate without creating such an implant tail problem due to channeling.

SUMMARY OF INVENTION

The present invention is concerned with a method for fabricating shallow junctions in a semiconductor substrate. By following the method of the present invention, shallow junctions of well-defined profile are obtained and problems occurring from implant tails of species previously used to preamorphize the substrate have been overcome.

In particular, the method of the present invention is concerned with fabricating shallow junctions of a first conductivity type into a semiconductor substrate of a second and opposite conductivity type. The method includes preamorphizing the substrate with a dopant of a second and opposite conductivity type than the first conductivity type. In other words, the preamorphizing is carried out with a dopant of the same type as the substrate. The dopant of the second and opposite conductivity type has a molecular weight that is substantially higher than the molecular weight of the substrate so as to provide a well-defined, sharp preamorphized region in the substrate. The doping with the dopant of the second and opposite conductivity type is to a depth which is at least sufficient for forming the desired shallow junction.

Next, the substrate is doped with a dopant of the first conductivity type in order to form the desired shallow junctions. The dosage levels of the first conductivity type are greater than those for the second and opposite conductivity type used for the preamorphizing.

BEST AND VARIOUS MODES FOR CARRYING OUT THE INVENTION

For convenience, the discussion of the fabrication steps of the present invention are directed to the preferred aspects of employing a silicon substrate as the semiconductive device. It is understood that when the discussion refers to n-type impurities, the process steps are applicable to p-type impurities and vice versa. Also, the present invention is applicable to substrates other than silicon which are known in the art. When reference is made to impurities or dopants of a "first type" and to impurities or dopants of a "second type", it is understood that the "first type" refers to n-type or p-type impurities and "second type" refers to the opposite conductivity type. That is, if the "first type" is p-, then the "second type" is n-. If the "first type" is n-, then the "second type" is p-.

In accordance with the present invention, the substrate is doped by ion implantation with a dopant having a conductivity type opposite the conductivity type of the intended dopant. This is referred to as the second and opposite conductivity type. The doping can be in preselected regions of the substrate such as by conventionally photolithographically masking the substrate for the ion implantation procedure which can be carried out using conventional equipment.

It is essential that the molecular weight of this dopant be significantly heavier such as at least about 1.5 times heavier than the molecular weight of the substrate so that the substrate will be preamorphized with a sharp, amorphous to crystalline interface and with minimal defective regions in accordance with the present invention.

Examples of suitable dopants of the p-type that can be used in this step of the process for p-type silicon substrates are indium and gallium, and preferably indium.

Examples of n-type dopants for n-type silicon substrates suitable for this step of the process of the present invention are antimony, bismuth, and arsenic and preferably antimony.

The dose of the second and opposite type dopant for the preamorphizing is usually from about $10^{13}$ to about $10^{15}$ and preferably about $5\times10^{13}$ to about $5\times10^{14}$ ions/cm$^2$. The heavier dopants are usually implanted at an energy level of about 10 to about 60 KeV, preferably about 20 to about 50 KeV, typical of which is about 40 KeV.

The dopants of the first type are then implanted into the substrate and into those areas that have been preamorphized.

The preferred p-type dopant is boron and the preferred n-type dopants are phosphorus and arsenic.

Accordingly, when the dopant of the first type is boron, then the dopant of the second and different type for the preamorphizing will be an n-type dopant such as antimony, bismuth, or arsenic.

On the other hand, when the dopant of the first type is n-type, such as phosphorus or arsenic, the dopant of the second and different type for the preamorphizing will be a p-type dopant such as gallium or indium.

The dose of the dopant of the first type must be greater than the dose of the dopant of the second and different type for the preamorphizing and is usually at least $10^{15}$ to about $2\times10^{16}$ ion/cm$^2$ The dopants of the first type are implanted at energy levels of about 3 to about 20, preferably 5–15, typical of which is about 5 KeV for boron and about 12 to about 15 KeV for phosphorus.

The shallow junctions produced by the present invention are preferably about 300 to about 1500 angstroms deep and most preferably about 500 to about 1000 angstroms deep.

The use of the dopants of the opposite type, but the same type as is the substrate pursuant to the present invention, although not eliminating implant tails, results in implant tails which, instead of blurring out the desired junction, actually sharpen it and lead to the shallow, well-defined profile achieved by the present invention.

In particular, the present invention results in the junction actually being surrounded by a region of higher dopant concentration than the background of the substrate, which helps in the threshold voltage control for the FET's employing this technique. In effect, the so-called "halo implant" is automatically achieved by following the present invention. In other words, the region around the junction will have a higher concentration of dopant that is the same type as the substrate. After the implantation with the dopants, the device is then annealed at elevated temperatures in order to anneal the damage to the substrate and have the implant become substitutional. The annealing can be carried out by employing a furnace anneal using temperatures such as at about 550° C. to about 950° C. for about 10 to about 90 minutes. The temperature and time being inversely related. In other words, the lower the temperature employed, the longer the time for the annealing and vice versa. Furthermore, if desired, the annealing can be a rapid type of anneal whereby incoherent light is used and the temperature reached is about 550° C. to about 1100° C., depending upon the dopant, with the time being between about 1 to about 20 seconds and preferably about 5 to about 10 seconds.

The following non-limiting example is presented to further illustrate the present invention:

EXAMPLE 1

Silicon substrates of the n-type having a resistivity of about 0.5 ohm-centimeter is first implanted at normal room temperatures with antimony ions at about 40 KeV to a dosage of about $5\times10^{13}$ ion/cm$^2$. The silicon substrates or wafers are then implanted in the same regions with boron ions at 5 KeV to a dosage of about $1\times10^{15}$ ion/cm$^2$.

The wafers are then annealed in a furnace at about 580° C. for about 30 minutes, followed by annealing at about 800° C. for about 30 minutes.

The junction depth of the boron is about 1400 angstroms (the junction depth corresponding to that depth where the boron had a concentration of $1\times10^{17}$ atoms/cm$^2$). The leakage current is extremely small, being about 12 nanoamps/cm$^2$.

Having thus described our invention, what we claim as new and desire to secure by Letters Patent is:

1. A method for fabricating shallow junctions of a first conductivity type in a semiconductor, silicon substrate of a second and opposite conductivity type which comprises:
   doping said silicon substrate of a second and opposite conductivity type with a dopant of a second and opposite conductivity type than said first conductivity type and wherein said dopant of a second and opposite conductivity type has a molecular weight substantially higher than said substrate, and wherein said doping is to a depth at least sufficient for forming said shallow junctions to preamorphize portions of said substrate; and
   then doping said substrate with a dopant of said first conductivity type to form said shallow junctions wherein the dosage of the dopant of said first type is higher than the dosage of said dopant of a second and opposite conductivity type.

2. The method of claim 1 wherein the dosage of said dopant of a second and opposite type is about $10^{13}$ to about $10^{15}$ ions/cm$^2$.

3. The method of claim 1 wherein the dosage of said dopant of a second and opposite type is about $5\times10^{13}$ to about $5\times10^{14}$ ions/cm$^2$.

4. The method of claim 1 wherein the dosage of said dopant of said first conductivity type is about $10^{15}$ to about $2\times10^{16}$ ions/cm$^2$.

5. The method of claim 3 wherein the dosage of said dopant of said first conductivity type is about $10^{15}$ to about $2\times10^{16}$ ions/cm$^2$.

6. The method of claim 1 wherein said shallow junctions are about 500 to 1000 angstroms below the substrate surface.

7. The method of claim 1 wherein said dopant of first conductivity type is boron.

8. The method of claim 7 wherein said dopant of a second and opposite conductivity type is selected from the group of antimony, bismuth, and arsenic.

9. The method of claim 7 wherein said dopant of a second and opposite conductivity type is antimony.

10. The method of claim 1 wherein said dopant of first conductivity type is phosphorus.

11. The method of claim 1 wherein said dopant of first conductivity type is phosphorus or arsenic.

12. The method of claim 10 wherein said dopant of a second and opposite conductivity type includes gallium or indium.

13. The method of claim 10 wherein said dopant of a second and opposite conductivity type is indium.

14. The method of claim 1 wherein the molecular weight of said dopant of a second and opposite conductivity type is at least about 1.5 times as heavy as that of the substrate.

15. The method of claim 1 wherein said shallow junctions are about 300 to about 1500 angstroms below the substrate surface.

* * * * *